United States Patent
Usa et al.

(10) Patent No.: US 7,973,297 B2
(45) Date of Patent: Jul. 5, 2011

(54) ELECTRON BEAM WRITING METHOD, FINE PATTERN WRITING SYSTEM, METHOD FOR MANUFACTURING UNEVEN PATTERN CARRYING SUBSTRATE, AND METHOD FOR MANUFACTURING MAGNETIC DISK MEDIUM

(75) Inventors: Toshihiro Usa, Odawara (JP); Kazunori Komatsu, Odawara (JP)

(73) Assignee: Fujifilm Corporation, Tokyo (JP)

(*) Notice: Subject to any disclaimer, the term of this patent is extended or adjusted under 35 U.S.C. 154(b) by 290 days.

(21) Appl. No.: 12/364,838

(22) Filed: Feb. 3, 2009

(65) Prior Publication Data
US 2009/0194711 A1    Aug. 6, 2009

(30) Foreign Application Priority Data
Feb. 4, 2008    (JP) .................... 2008-024023

(51) Int. Cl.
*H01J 3/14* (2006.01)
*G11B 5/02* (2006.01)
(52) U.S. Cl. .............. 250/492.3; 360/51; 360/77.08; 250/396 R
(58) Field of Classification Search ............ 250/492.3; 360/51, 77.03
See application file for complete search history.

(56) References Cited

U.S. PATENT DOCUMENTS

| | | | |
|---|---|---|---|
| 6,204,989 B1 * | 3/2001 | Hrinya et al. | 360/77.06 |
| 6,304,407 B1 * | 10/2001 | Baker et al. | 360/75 |
| 6,738,205 B1 * | 5/2004 | Moran et al. | 360/17 |
| 6,954,323 B2 * | 10/2005 | Deeman et al. | 360/51 |
| 7,218,470 B2 * | 5/2007 | Deeman et al. | 360/75 |

FOREIGN PATENT DOCUMENTS

| JP | 2006-184924 | 7/2006 |
|---|---|---|
| JP | 2006184924 A * | 7/2006 |

* cited by examiner

*Primary Examiner* — Robert Kim
*Assistant Examiner* — David E Smith
(74) *Attorney, Agent, or Firm* — Young & Thompson

(57) ABSTRACT

When writing a hard disk pattern on a substrate applied with a resist by scanning an electron beam on the substrate while rotating a rotation stage, writing is started with respect to each radial direction position of each area based on a predetermined encoder pulse for each radial direction position among those generated according to the rotational angle of the rotation stage that occurs after a predefined encoder pulse that occurs ahead in a rotational direction of a radial direction position whose write start position in a circumferential direction in each area arrives first at the writing position as the rotation stage rotates and ahead of the write start position in the circumferential direction with respect to each radial direction position, and after a predetermined time from the predetermined encoder pulse.

9 Claims, 9 Drawing Sheets

WRITING PATTERN

ENCODER PULSE

TIME (ROTATIONAL ANGLE)

ELECTRON BEAM WRITING METHOD, FINE PATTERN WRITING SYSTEM, METHOD FOR MANUFACTURING UNEVEN PATTERN CARRYING SUBSTRATE, AND METHOD FOR MANUFACTURING MAGNETIC DISK MEDIUM

BACKGROUND OF THE INVENTION

1. Field of the Invention

The present invention relates to an electron beam writing method and a fine pattern writing system for writing a fine pattern according to a desired uneven pattern when manufacturing an imprint mold, magnetic transfer master substrate, or the like for a high density magnetic recording medium, such as a discrete track medium, bit pattern medium, or the like.

The invention also relates to a method for manufacturing an uneven pattern carrying substrate, including an imprint mold, magnetic transfer master substrate or the like, having an uneven pattern surface formed through a writing step performed by the electron beam writing method described above. The invention further relates to a method for manufacturing a magnetic disk medium having an uneven pattern transferred thereto from the uneven pattern carrying substrate or imprint mold, and a method for manufacturing a magnetic disk medium having a magnetic pattern transferred thereto from the magnetic transfer master substrate.

2. Description of the Related Art

Generally, information patterns, such as servo patterns and the like are formed on current magnetic disk media. In view of the demand of higher recording density, a discrete track medium (DTM) in which magnetic interference between adjacent data tracks is reduced by separating the tracks with a groove pattern (guard band) has been attracting wide attention. A bit pattern medium (BPM) proposed for achieving still higher density is a medium in which magnetic substances forming single magnetic domains (single-domain particles) are physically isolated and disposed regularly, and one bit is recorded in a single particle.

Heretofore, fine patterns, such as servo patterns and the like, have been formed on magnetic media by uneven patterns, magnetic patterns, or the like and an electron beam writing method for patterning a predetermined fine pattern on a master of a magnetic transfer master substrate or the like has been proposed. In the electron beam writing method, a pattern is written on a substrate applied with a resist by irradiating thereon an electron beam corresponding to the shape of the pattern while rotating the substrate as described, for example, in U.S. Pat. No. 7,026,098 and Japanese Unexamined Patent Publication No. 2006-134924.

The electron beam writing method described in U.S. Pat. No. 7,026,098 is a method in which when, for example, writing a rectangular or parallelogram element constituting a servo pattern extending in the width direction of a track, the electron beam is deflected in a radial direction while being vibrated rapidly in a circumferential direction, thereby scanning the beam so as to completely fill the area of the element.

Japanese Unexamined Patent Publication No. 2006-184924 discloses, as on/off writing method, a method in which pattern writing is performed by on/off irradiating an electron beam on a substrate applied with a resist according to the shape of a pattern while rotating the substrate, and shifting the substrate or electron beam irradiation unit by one beam width every rotation of the substrate in a radial direction. It also discloses an electron beam writing method in which the electron beam is vibrated back and forth in a track width direction of a pattern. It further discloses a method for controlling write start timing of a servo pattern.

Figure 12:
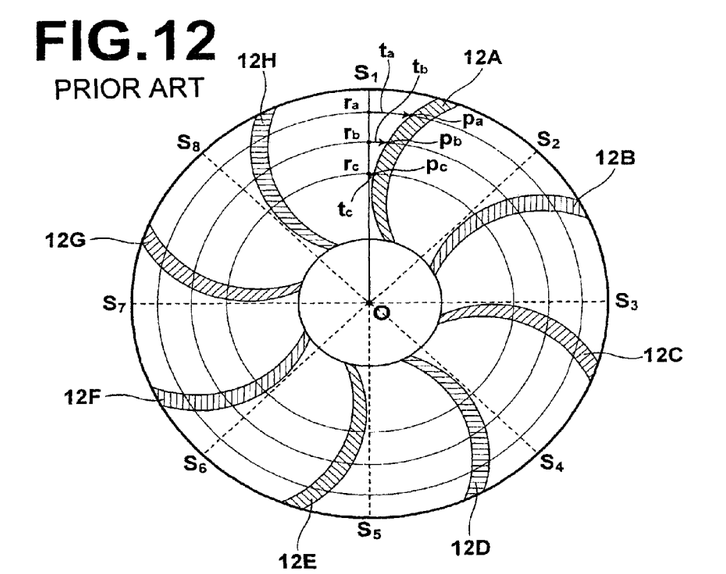
FIG. 12 is a schematic view of a hard disk pattern illustrating the write start timings of a servo area in a conventional writing method.
Figure 13:
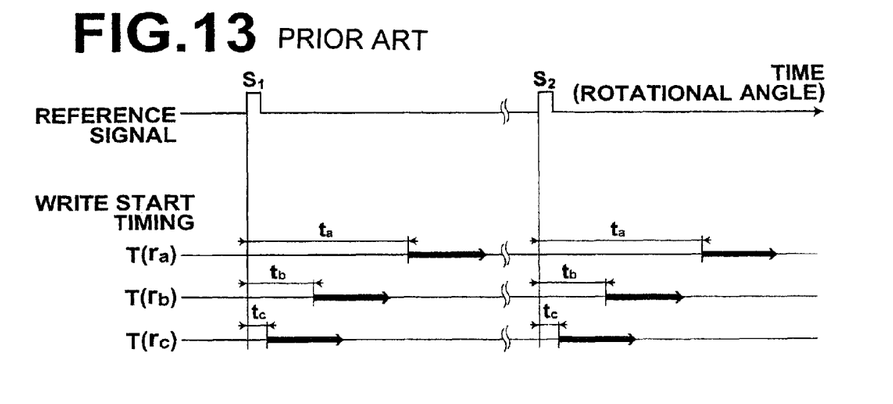
FIG. 13 illustrates the reference signal and the write start timing at each position in the radial direction in the conventional writing method.

In the control method disclosed in Japanese Unexamined Patent Publication No. 2006-184924, the write start timing of a servo pattern is controlled such that the writing is started after a predetermined standby time from reference signal S1. The reference signal is preferable to be outputted as many as a number of servo areas to be written in one rotation, and the write start timing of the servo pattern in each servo area is determined based on the reference signal outputted according to each servo area. More specifically, the timing control is thought to be like that shown in FIGS. 12 and 13. That is, for example, where a hard disk pattern is a pattern having 8 servo areas 12A, 12B - - - 12H, as shown in FIG. 12, the writing unit is configured to output 8 reference signals $S_1$, $S_2$, - - - $S_8$ during one rotation, and the writing is started in each of servo areas 12A, 12B - - - 12H based on each reference signal outputted according to each servo area. More specifically, the writing of servo area 12A is started based on reference signal $S_1$, and the writing of servo area 12B is started based on reference signal $S_2$. Generally, the servo area is an area extending from the inner circumferential side to the outer circumferential side in an arc, and the write start position of the servo pattern in a circumferential direction is different depending on the position in the radial direction (track), as illustrated in FIG. 12. That is, as illustrated in FIG. 12, the write start positions for the pattern in servo area 12A for radial direction positions $r_a$, $r_b$, $r_c$ are $p_a$, $p_b$, and $p_c$ respectively, and the positions thereof in the circumferential direction (rotational direction positions) are different from each other. Here, according to the description of Japanese Unexamined Patent Publication No. 2006-184924, the writing is started for radial direction positions $r_a$, $r_b$, $r_c$ after predetermined standby times ($t_a$, $t_b$ and $t_c$ respectively) from reference signal $S_1$, as illustrated in FIG. 13. Accordingly, depending on the distance from the position of reference signal $S_1$ to the write start position, the standby time from reference signal $S_1$ becomes long or short. That is, there is a large difference between the standby time to start writing at a radial direction position with a minimum distance from the position of reference signal $S_1$ to the write start position and the standby time to start writing at a radial direction position with a maximum distance from the position of reference signal $S_1$ to the write start position. Unlike the number of servo areas and the curvature of the arc typically employed, FIG. 12 illustrates less number of servo areas (8 areas) with a larger curvature for the arc for clarity and facilitating understanding.

Figure 7:
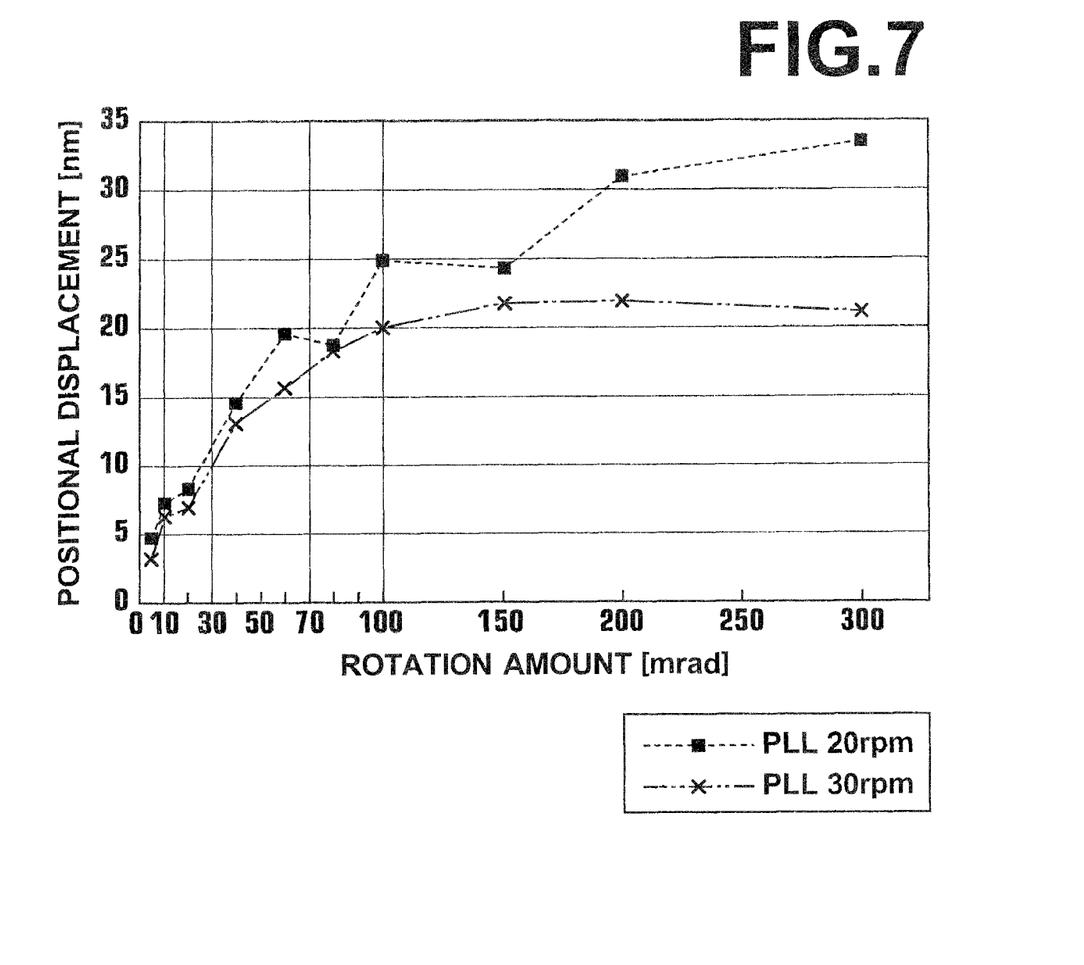
FIG. 7 is a graph representing the relationship between the rotation amount from predetermined encoder pulses and positional displacement amount.

The inventors of the present invention have studied the relationship between the number of pulses from predetermined encoder pulses (only from A-phase encoder pulses) and the mount of positional displacement (nm) using a rotary encoder having a predetermined number of encoder slits, the results of which is shown in FIG. 7. In FIG. 7, the horizontal axis represents the rotation amount obtained from the number of pulses (mrad), and the amount of positional displacement at each rotation amount is calculated from the encoder pulse jitter. The amounts of positional displacement are obtained for PLL control method when the rotational speed is set to 20 rpm and 30 rpm. The results have revealed that, in both of the rotational speeds, positional displacement occurs in the amounts of not less than 10 nm and not less than 20 nm when the rotation amount exceeds 30 mrad and 100 mrad from the reference measurement position respectively.

The current arc shaped servo area has a difference in rotational position up to about 70 mrad for pattern start positions. Thus, in a configuration in which writing of an arc shaped servo area is started after defined standby times from the same reference signal regardless of the radial direction position, as in Japanese Unexamined Patent Publication No. 2006-184924, the rotation amount of the farthest write start position from the reference signal is about 70 mrad, and FIG. 7 shows that the amount of positional displacement at the position is 15 to 20 nm. The positional displacement of about 15 to 20 nm will not pose any significant problem if a bit length exceeds 200 nm, but when the bit length becomes on the order of not greater than 100 nm in response to the demand of higher recording density, the positional displacement of 15 to 20 nm will lead to the degradation of tracking accuracy.

The present invention has been developed in view of the circumstances described above, and it is an object of the present invention to provide an electron beam writing method and fine pattern writing system capable of improving the accuracy of write start position of a pattern.

It is a further object of the present invention to provide a method for manufacturing an uneven pattern carrying substrate, such as imprint mold, magnetic transfer master substrate, or the like, having a pattern accurately written by an electron beam. It is a still further object of the present invention to provide a method for manufacturing a magnetic disk medium having an uneven pattern or a magnetic pattern transferred thereto using the uneven pattern carrying substrate.

SUMMARY OF THE INVENTION

An electron beam writing method of the present invention is a method for writing a pattern on a substrate applied with a resist and placed on a rotation stage having a rotary encoder by scanning an electron beam on the substrate while rotating the rotation stage, wherein, when writing a hard disk pattern constituted by a plurality of servo areas, each extending in an arc from the radial center side to outside, and data areas, which are regions between the servo areas, writing is started with respect to each radial direction position of each of the areas based on a predetermined encoder pulse for each radial direction position among those generated according to the rotational angle of the rotation stage that occurs after a predefined encoder pulse that occurs ahead in a rotational direction of a radial direction position whose write start position in a circumferential direction in each of the areas arrives first at the writing position as the rotation stage rotates and ahead of the write start position in the circumferential direction with respect to each radial direction position, and after a predetermined time from the predetermined encoder pulse.

Preferably, the predetermined encoder pulse is an encoder pulse that occurs at a rotational position of the rotation stage within 30 mrad, more preferably within 20 mrad, further preferably within 5 mrad, and most preferably immediately ahead of the write start position in the circumferential direction of each radial direction position. That is, it is preferable that the writing is started with respect to each radial direction position of each of the areas after a predetermined time from the encoder pulse that occurs immediately ahead of the write start position among those generated according to the rotational angle of the rotation stage.

Preferably, a pattern of a plurality of fine elements constituting the servo area is written by scan controlling the electron beam so as to completely fill the shapes of the elements in sequence by rapidly vibrating the electron beam back and forth in a direction orthogonal to the radial direction of the rotation stage and X-Y deflecting the electron beam in the radial direction of the rotation stage and the direction orthogonal to the radial direction while rotating the substrate in one direction.

A fine pattern writing system of the present invention is a system for realizing the electron beam writing method described above, comprising a signal output unit for outputting a write data signal and an electron beam writing unit for scanning an electron beam.

Preferably, the electron beam writing unit of the fine pattern writing system includes a rotation stage movable in a radial direction thereof while rotating a substrate applied with a resist, an electron gun that emits an electron beam, a deflection means that X-Y deflects the electron beam in the radial direction of the rotation stage and a direction orthogonal to the radial direction and rapidly vibrates the electron beam in the direction orthogonal to the radial direction, a blanking means that blocks the radiation of the electron beam other than a writing area, and a controller that performs associated operation control of each of the means, and the signal output unit is a unit that outputs a write data signal to the controller of the electron beam writing unit based on data corresponding to the form of a fine pattern to be written on the substrate, wherein the controller is a controller that performs control such that, when writing a hard disk pattern constituted by a plurality of servo areas, each extending in an arc from the radial center side to outside and data areas, each between each of the servo areas, writing is started with respect to each radial direction position of each of the areas based on a predetermined encoder pulse for each radial direction position among those generated according to the rotational angle of the rotation stage that occurs after a predefined encoder pulse that occurs ahead in a rotational direction of a radial direction position whose write start position in a circumferential direction in each of the areas arrives first at the writing position as the rotation stage rotates and ahead of the write start position in the circumferential direction with respect to each radial direction position, and after a predetermined time from the predetermined encoder pulse.

Preferably, the predetermined encoder pulse is an encoder pulse that occurs at a rotational position of the rotation stage within 30 mrad, more preferably within 20 mrad, further preferably within 5 mrad, and most preferably immediately ahead of the write start position in the circumferential direction of each radial direction position. That is, it is preferable that the writing is started with respect to each radial direction position of each of the areas after a predetermined time from the encoder pulse that occurs immediately ahead of the write start position among those generated according to the rotational angle of the rotation stage.

A method for manufacturing an uneven pattern carrying substrate of the present invention is a method comprising the steps of exposure writing a desired fine pattern on a substrate applied with a resist by the electron beam writing method described above, and forming an uneven pattern corresponding to the desired fine pattern on the substrate. Here, the uneven pattern carrying substrate is a substrate having thereon a desired uneven pattern, such as an imprint mold for transferring the shape of the uneven pattern to a target medium, a magnetic transfer master substrate for transferring a magnetic pattern corresponding to the shape of the uneven pattern to a target medium, or the like.

A method for manufacturing a magnetic disk medium of the present invention is a method that uses an imprint mold produced through the steps of exposure writing a desired fine pattern on a substrate applied with a resist by the electron beam writing method described above and forming an uneven pattern corresponding to the desired fine pattern on the substrate to transfer an uneven pattern corresponding to the uneven pattern provided on the surface of the mold to the magnetic disk medium.

Another method for manufacturing a magnetic disk medium of the present invention is a method that uses a magnetic transfer master substrate produced through the steps of exposure writing a desired fine pattern on a substrate applied with a resist by the electron beam writing method described above and forming an uneven pattern corresponding to the desired fine pattern on the substrate to transfer a magnetic pattern corresponding to the uneven pattern provided on the surface of the master substrate to the magnetic disk medium.

According to the electron beam writing method of the present invention, which is an electron writing method for writing a pattern on a substrate applied with a resist and placed on a rotation stage having a rotary encoder by scanning an electron beam on the substrate while rotating the rotation stage, when writing a hard disk pattern constituted by a plurality of servo areas, each extending in an arc from the radial center side to outside and data areas, each between each of the servo areas, writing is started with respect to each radial direction position of each of the areas based on a predetermined encoder pulse for each radial direction position among those generated according to the rotational angle of the rotation stage that occurs after a predefined encoder pulse that occurs ahead in a rotational direction of a radial direction position whose write start position in a circumferential direction in each of the areas arrives first at the writing position as the rotation stage rotates and ahead of the write start position in the circumferential direction with respect to each radial direction position, and after a predetermined time from the predetermined encoder pulse. In comparison with a conventional method in which write start timings are counted from one reference signal for one area whose write start positions are shifted in a circumferential direction with respect to radial direction positions, this allows the use of an appropriate encoder pulse for each of the radial direction positions, which reduces the standby time (predetermined time) from the reference encoder pulse to the start of writing at each radial direction position in comparison with the conventional method, whereby the standby time from the encoder pulse may be property adjusted within an allowable range of positional displacement. Accordingly, the write start position at each radial direction position may be set accurately, resulting in writing of a pattern with improved positional accuracy.

In particular, the use of an encoder pulse that occurs preferably within 30 mrad, more preferably within 20 mrad, further preferably within 5 mrad, and most preferably immediately ahead of the write start position in the circumferential direction for each radial direction position as the reference allows further improvement of the positional accuracy of the pattern.

Further, where the fine elements are written by scan controlling the electron beam so as to completely fill the shapes of the elements in sequence by rapidly vibrating the electron beam back and forth in a direction orthogonal to the radial direction of the rotation stage and X-Y deflecting the electron beam in the radial direction of the rotation stage and the direction orthogonal to the radial direction while rotating the substrate in one direction, the servo pattern within one track may be written rapidly and highly accurately during one rotation of the substrate.

In the mean time, the fine pattern writing system for realizing the electron beam writing method of the present invention includes a signal output unit for outputting a write data signal and an electron beam writing unit for scanning an electron beam, so that a desired fine pattern may be written rapidly and highly accurately.

In particular, a preferable system as the fine pattern writing system may be built in the following manner. That is, the electron beam writing unit includes a rotation stage movable in a radial direction thereof while rotating a substrate applied with a resist, an electron gun that emits an electron beam, a deflection means that X-Y deflects the electron beam in the radial direction of the rotation stage and a direction orthogonal to the radial direction and rapidly vibrates the electron beam in the direction orthogonal to the radial direction, a blanking means that blocks the radiation of the electron beam other than a writing area, and a controller that performs associated operation control of each of the means. The signal output unit is a unit that outputs a write data signal to the controller of the electron beam writing unit based on data corresponding to the form of a fine pattern to be written on the substrate. Here, the controller performs control such that, when writing a hard disk pattern constituted by a plurality of servo areas, each extending in an arc from the radial center side to outside and data areas, each between each of the servo areas, writing is started at each position of each of the areas in a radial direction based on a predetermined encoder pulse for each radial direction position among those generated according to the rotational angle of the rotation stage that occurs after a predefined encoder pulse that occurs ahead, in a rotational direction of the rotation stage, of a radial direction position whose write start position in a circumferential direction in each of the areas arrives first at the writing position as the rotation stage rotates and ahead of the write start position of each radial direction position, and after a predetermined time from the predetermined encoder pulse.

Further, according to the method for manufacturing an uneven pattern carrying substrate of the present invention, the method includes the steps of exposure writing a desired fine pattern on a substrate applied with a resist by the electron beam writing method described above and forming an uneven pattern corresponding to the desired fine pattern on the substrate. Thus, a substrate having thereon a highly accurate uneven pattern may be obtained easily. In particular, in the case of the imprint mold, when performing shape patterning using imprint technology, the shape may be transferred to the surface of the medium at a time by pressing the imprint mold onto the surface of a resin layer serving as a mask in the process of forming a magnetic disk medium, whereby a magnetic disk medium, such as discrete track medium or bit pattern medium, with excellent characteristics may be produced easily. In the case of the magnetic transfer master substrate, the substrate has thereon a fine pattern of a magnetic layer, so that a magnetic recording medium having excellent properties may be manufactured easily by bringing the master substrate into contact with the magnetic recording medium and applying a magnetic field thereto using magnetic transfer technology, and transfer forming a magnetic pattern corresponding to the pattern of the magnetic layer of the master substrate on the magnetic recording medium.

DESCRIPTION OF THE PREFERRED EMBODIMENTS

Figure 1:
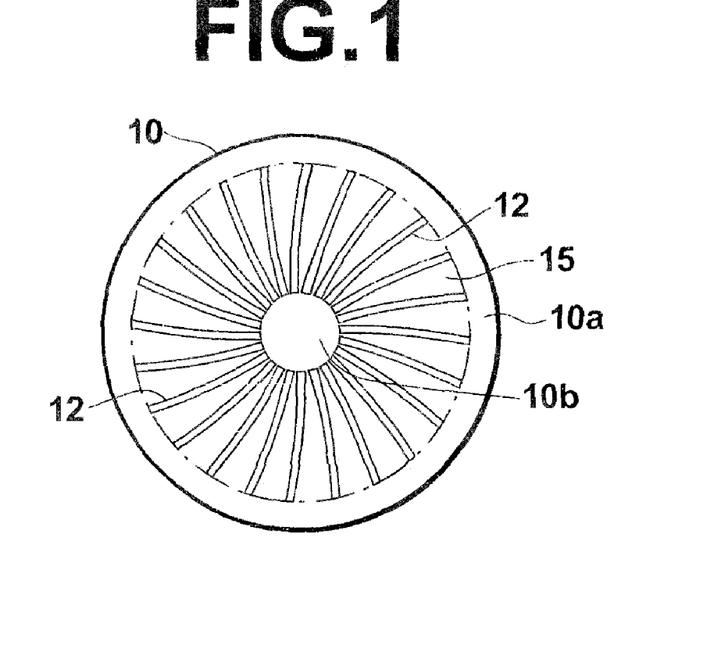
FIG. 1 illustrates an example hard disk pattern in plan view to be written on a substrate by an electron beam writing method of the present invention.
Figure 2:
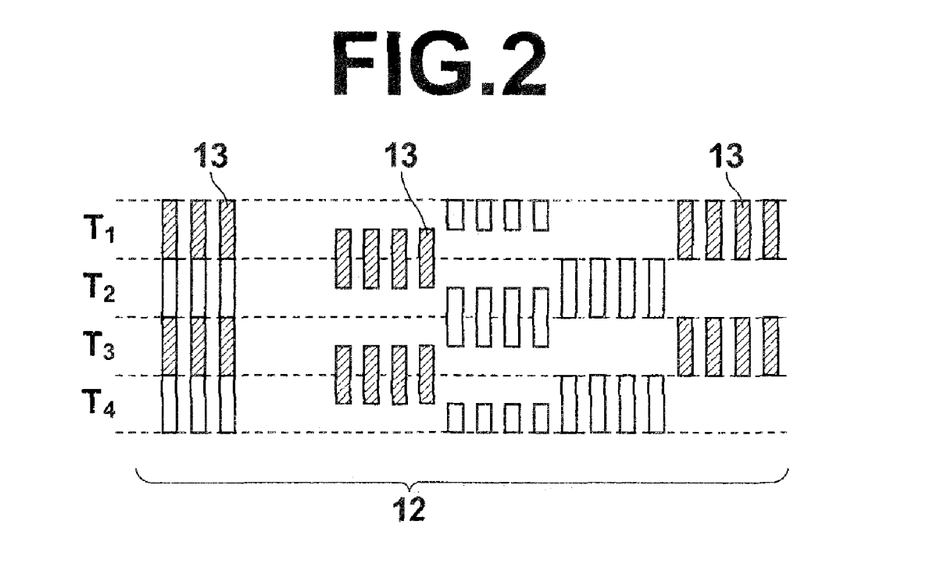
FIG. 2 is a partially enlarged view of the hard disk pattern.
Figure 3A:
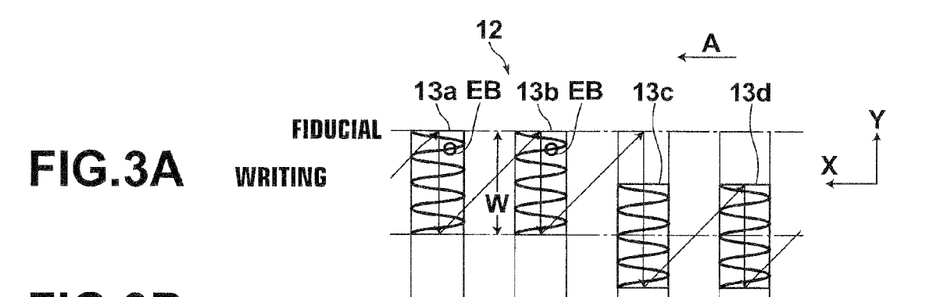
FIG. 3A is an enlarged schematic view of a basic writing principle for writing elements constituting a fine pattern.

Hereinafter, exemplary embodiments of the present invention will be described with reference to the accompanying drawings. FIG. 1 is an overall plan view of a fine pattern of a magnetic disk medium (hard disk pattern) to be written on a substrate by an electron beam writing method of the present invention. FIG. 2 is a partially enlarged view of the fine pattern. FIG. 3A is an enlarged schematic view of a basic writing principle for writing elements constituting the fine pattern. FIGS. 3B to 3F illustrate various control signals, including a deflection signal and the like, used in the writing principle.

As illustrated in FIGS. 1 and 2, a fine pattern of fine uneven shape for a magnetic disk medium includes servo patterns 12 formed in a plurality of servo areas, and data area 15 is provided between servo areas 12. The fine pattern is formed on an annular region of disk-shaped substrate 10 (circular substrate) excluding outer circumferential portion 10a and inner circumferential portion 10b.

Servo patterns 12 are formed in elongated areas (servo areas) substantially radially extending from the center to each sector on concentric tracks of substrate 10 at regular intervals. Generally, the servo area is formed in an arc extending in a radial direction. As shown in FIG. 2, which is a partially enlarged view of the servo area, fine rectangular servo elements 13 corresponding, for example, to preamble, address, and burst signals are disposed on concentric tracks T1 to T4. One servo element 13 has a width corresponding to one track width and a length in the track direction which is greater than an irradiation diameter of the electron beam. Some of servo elements 13 of burst signals are shifted by a half track width and extending over the adjacent track.

Figure 8A:
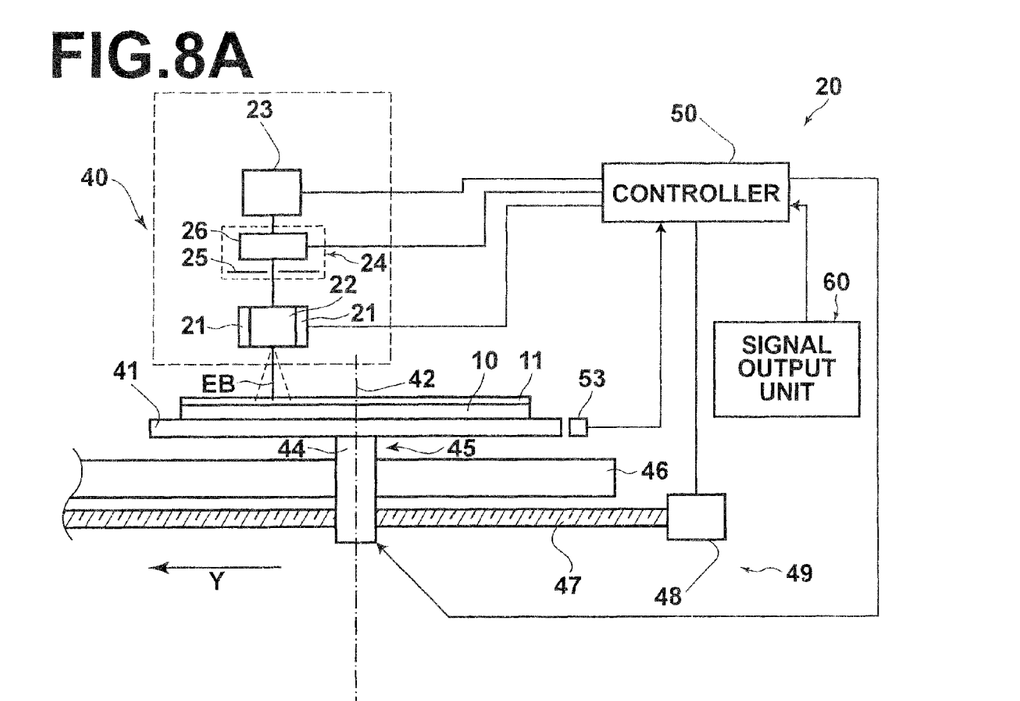
FIG. 8A is a relevant side view of a fine pattern writing system according to an embodiment for implementing the electron beam writing method of the present invention.

When writing each servo element 13 of servo patterns 12, substrate 10 applied with resist 11 is placed on rotation stage 41 (FIG. 8) to be described later, and while substrate 10 is rotated, elements 13 are sequentially scanned with electron beam EB to radiation expose resist 11 for one track at a time from a track on the inner circumferential side to a track on the outer circumferential side or vice versa.

FIGS. 3A to 3F illustrate an embodiment of the electron beam writing method of the present invention. In the present embodiment, servo patterns 13c and 13d extending over the adjacent track are sequentially written following in-track servo elements 13a and 13b of servo pattern 12 at a time during one rotation of substrate 10 (rotation stage 41). That is, while substrate 10 is unidirectionally rotated in A direction, servo elements 13a to 13d are sequentially written at predetermined phase positions on a concentric track (track width: W) which, when viewed microscopically, extends linearly by scanning electron beam EB having a small diameter so as to completely fill the shapes thereof.

The scanning of electron beam EB is performed in the following manner. That is, while electron beam EB having a smaller beam diameter than a minimum track direction length of servo elements 13a to 13d is irradiated through ON/OFF operation of blanking means 24, to be described later, according to the writing region, electron beam EB is X-Y deflected in radial direction Y and circumferential direction X orthogonal to radial direction Y according to the rotational line speed of substrate 10 (rotation stage 41) to rapidly vibrate the beam back and forth in circumferential direction X at a constant amplitude and to deflect the beam in radial direction Y as shown in FIG. 3A, whereby exposure writing is performed. Following the writing of in-track servo elements 13a and 13b, the writing fiducial in radial direction Y is shifted by a half track width to write servo elements 13c and 13d extending over the adjacent track in the same manner as described above.

The writing will be described in detail with reference to FIGS. 3A to 3F. FIG. 3A illustrates the writing operation of electron beam EB in radial direction Y and circumferential direction X (rotational direction A), FIG. 3B illustrates deflection signal Def(Y) in radial direction Y, FIG. 3C illustrates deflection signal Def(X) in circumferential direction X, FIG. 3D illustrates vibration signal Mod (X) in circumferential direction X, FIG. 3E illustrates ON/OFF operation of blanking signal BLK, FIG. 3F illustrates synchronous performance by encoder pulses, in which the horizontal axis represents time.

First, at points "a", blanking signal BLK (FIG. 3E) is turned OFF to start writing servo element 13a by irradiating electron beam EB. While being vibrated back and forth in circumferential direction X by vibration signal Mod (X) (FIG. 3D), electron beam EB at the fiducial position is deflected by deflection signal Def (Y) (FIG. 3B) and moved in radial direction (−Y), and at the same time deflected and moved in circumferential direction X which is the same direction as A direction by deflection signal Def(X) (FIG. 3C) in order to compensate for displacement of the irradiation position of electron beam EB arising from the rotation of substrate 10 in A direction, whereby electron beam EB is scanned so as to completely fill rectangular servo elements 13a. Then, at point "b", blanking signal BLK is turned ON to terminate the irradiation of electron beam EB and writing of element 13a. After point "b", the deflections in radial direction Y and circumferential direction X are returned to the fiducial position.

Next, as substrate 10 is rotated and reaches point "c", the writing of next servo element 13b is started in the same manner as described above, and identical writing is performed based on the identical deflection signals, and the writing is stopped at point "d".

Figure 3B:
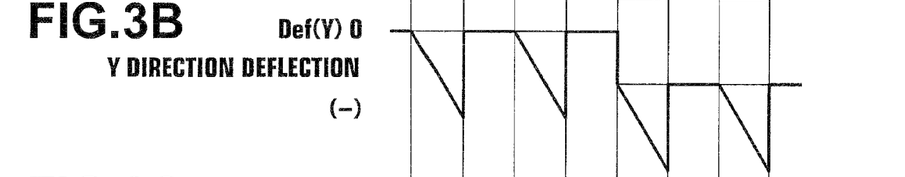
FIGS. 3B to 3F illustrate various control signals, including a deflection signal and the likes used in the writing principle.
Figure 3C:
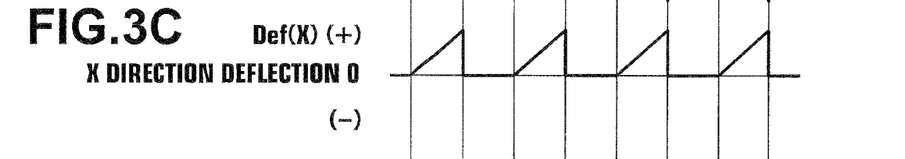
Figure 3D:
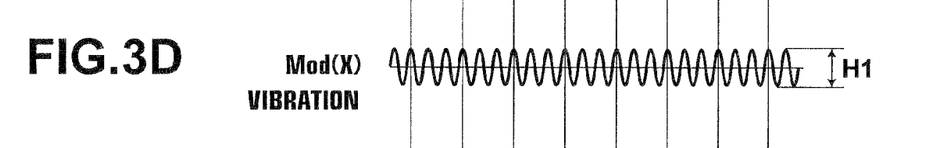
Figure 3E:
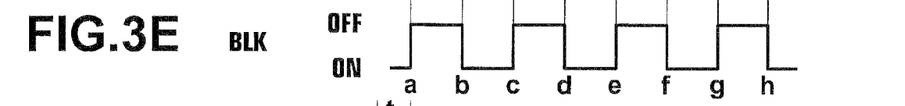
Figure 3F:
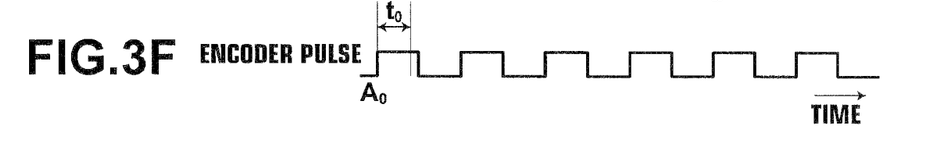

Following this, deflection signal Def(Y) in FIG. 3B is shifted by a half-track width in radial direction (−Y) at point "e", and writing is performed in the same manner as described above from that fiducial position. That is, while being vibrated back and forth in circumferential direction X by vibration signal Mod (X) (FIG. 3D), electron beam EB at the fiducial position is deflected by deflection signal Def (Y) (FIG. 3B) and moved in radial direction (−Y), and at the same time deflected and moved in circumferential direction X which is the same direction as A direction by deflection signal Def(X) (FIG. 3C), whereby electron beam EB is scanned so as to completely fill rectangular servo elements 13c. Then, at point "f", blanking signal BLK is turned ON to terminate the irradiation of electron beam EB and writing of element 13c. After point "f", the deflections in radial direction Y and circumferential direction X are returned to the fiducial position.

Then, as substrate 10 is rotated and reaches point "g", writing of next servo element 13d is started in the same manner as described above, and identical writing is performed based on the identical deflection signals, and the writing is stopped at point "h".

Note that when writing servo elements 13, accurate positioning is performed at writing start point with respect to each servo area, i.e., at point "a" in FIG. 3E, based on the encoder pulse signal in FIG. 3F to improve accuracy of the forming position of the servo patterns 12 in one round.

After writing for one track in one round, the writing is performed for the next track in the same manner as described above, thereby writing a desired fine pattern on the entire writing area of substrate 10. The track migration of writing position (radial direction) is performed by moving electron beam EB in radial direction Y or linearly moving rotation stage 41, to be described later, in radial direction Y. The linear movement of the rotation stage may be performed for the writing of every plurality of tracks according to the deflectable range of electron beam EB in radial direction Y or for the writing of each track. Preferably, however, the track migration is performed by first deflecting the electron beam within the deflectable range in radial direction Y by the deflection means to write for a plurality of tracks because it is more efficient, then tentatively releasing the deflection by beam deflection means 21 in radial direction Y, and moving the rotation stage in radial direction for about a plurality of tracks using linear moving means 49.

The writing length of servo elements 13 in circumferential direction X (bit length) is defined by the amplitude of the back and forth vibrations of electron beam EB in circumferential direction X.

Preferably, writing by electron beam EB is performed by controlling the rotational speed of rotation stage 41 so as to be slow in the writing for the outer circumferential side and fast for the inner circumferential side so that the same linear speed is ensured over the entire writing area of substrate 10 when writing position in the writing area of substrate 10 is moved in the radial direction, i.e., when performing track migration from the viewpoint of securing a uniform radiation dose and accuracy of writing position.

Deflection signal Def(X) in circumferential direction X allows writing of any parallelogram element by adjusting the magnitude, as well as compensation for the displacement of writing position arising from the rotation of rotation stage 41 when writing a rectangular element shown in FIG. 3A.

The intensity of electron beam EB is set to a value which is sufficient to expose resist 11 by rapid vibration writing of servo elements 13.

As described above, electron beam EB is scanned in order to write each element 13 of servo pattern 12. For performing the scanning control of electron beam EB, a write data signal is sent from signal output unit 60 (FIG. 8) to controller 50 of electron beam writing unit 40, to be described later. The timing and phase of the output signal are controlled based on the encoder pulse signal generated according to the rotation of rotation stage 41 and a reference clock signal. More specifically, where element 13a is the first element to be written in the servo area in FIG. 3A, the writing of element 13a is controlled so as to be started after predetermined time to from encoder pulse $A_0$.

Figure 4:
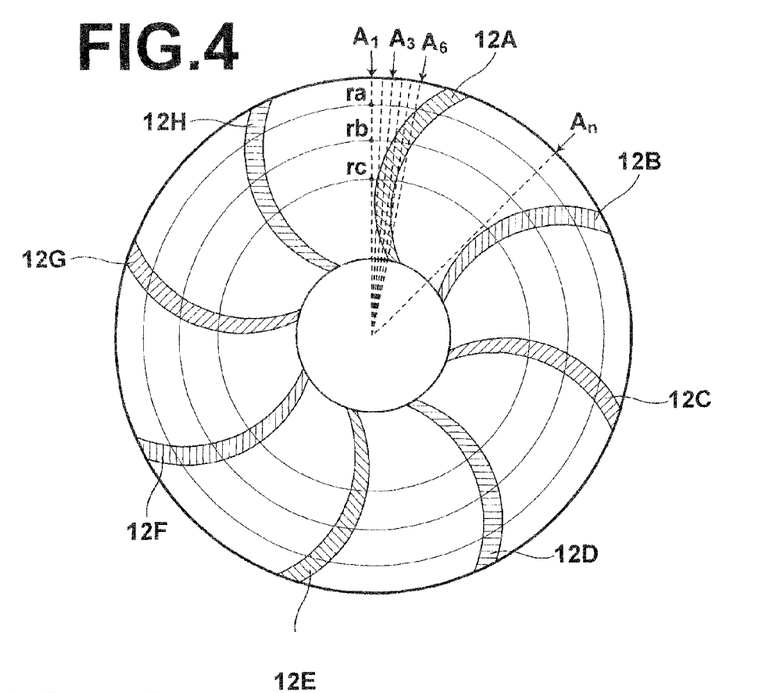
FIG. 4 is a schematic view of a hard disk pattern illustrating the write start timings of a servo area.
Figure 5A:
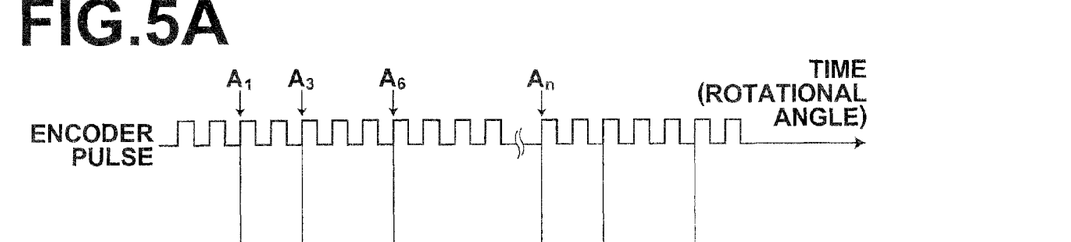
FIG. 5A illustrates encoder pulses.
Figure 5B:
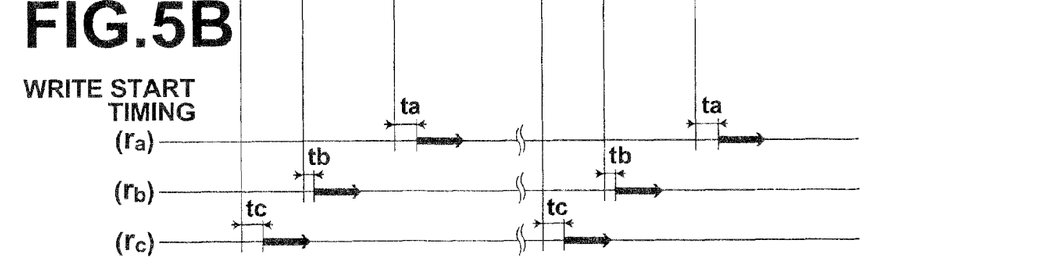
FIG. 5B illustrates the write start timing at each position in the radial direction.
Figure 6A:
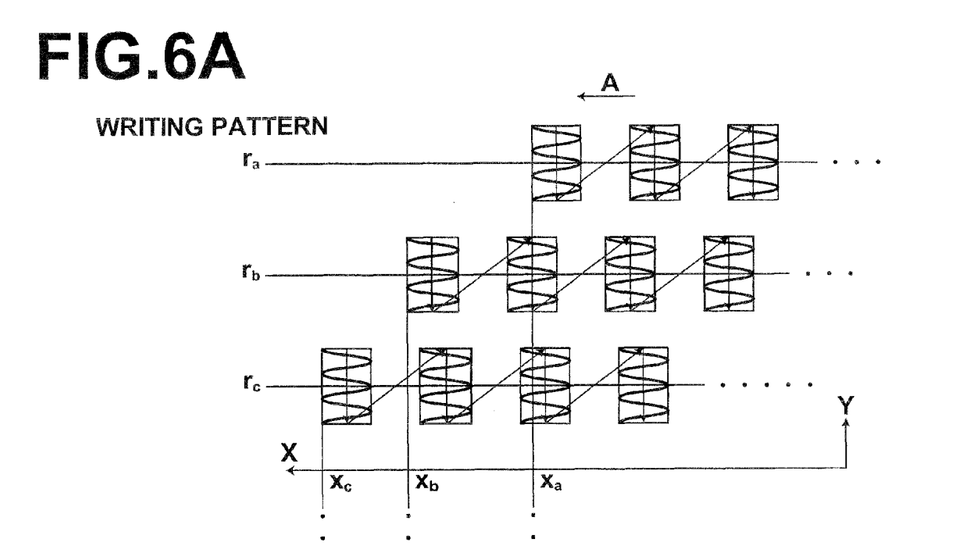
FIG. 6A illustrates a writing pattern at each position in the radial direction.
Figure 6B:
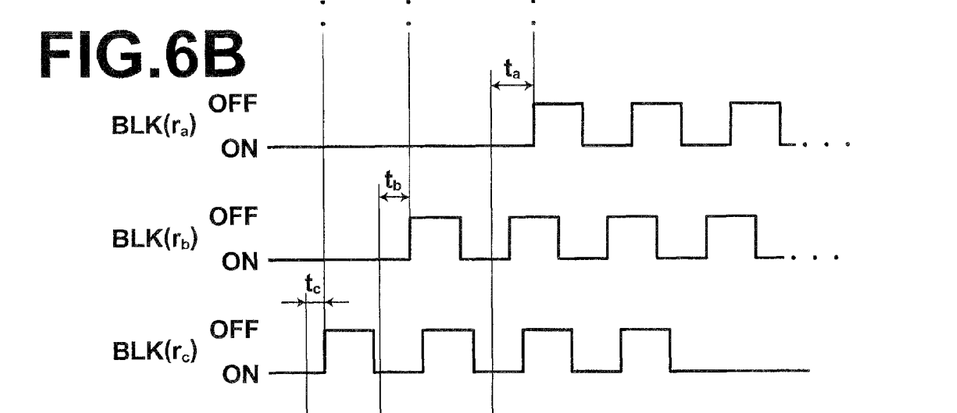
FIG. 6B illustrates on/off operation of blacking signal BLK.
Figure 6C:
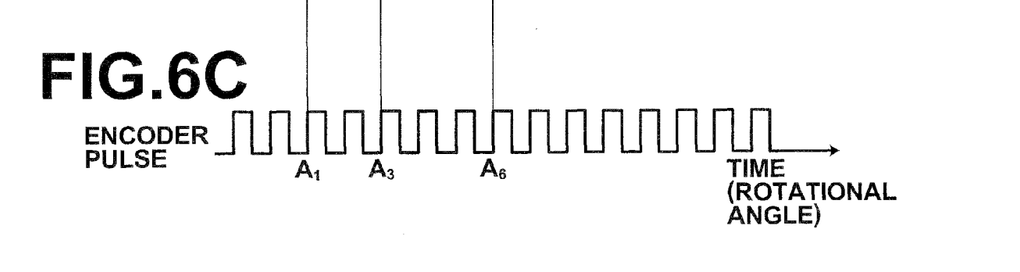
FIG. 6C illustrates encoder pulses.

Control of write start timing based on the encoder pulse signal will be described with reference to FIGS. 4 to 6. FIG. 4 is a schematic view of a hard disk pattern illustrating the write start timings of a servo area. FIG. 5A illustrates encoder pulses and FIG. 5B illustrate the write start timing at each position in the radial direction. FIG. 6A illustrates a writing pattern at each position in the radial direction. FIG. 6B illustrates on/off operation of blanking signal BLK, and FIG. 6C illustrates encoder pulses.

As shown in FIGS. 4, 5A, and 5B, each of pattern starting timings at different radial direction positions $r_a$, $r_b$, and $r_c$ of servo area 12A is controlled such that the writing of the pattern is started after a predetermined time from an encoder pulse that occurs ahead and immediately ahead of the writing position among those generated as the rotation stage rotates. Here, it is assumed that encoder pulses $A_1$, $A_2$, $A_3$, - - - $A_n$ - - - are sequentially generated according to the rotational angle, as shown in FIG. 4. In the writing method of the present embodiment, the writing of the pattern at radial direction position $r_a$ is started after time $t_a$ from encoder pulse $A_6$, the writing of the pattern at radial direction position $r_b$ is started after time $t_b$ from encoder pulse $A_3$ and the writing of the pattern at radial direction position $r_c$ is started after time $t_c$ from encoder pulse $A_1$, as shown in FIGS. 5A and 5B.

This will be described in more detail with reference to FIGS. 6A to 6C. As shown in FIG. 6A, the write start positions in the circumferential direction at radial direction positions $r_a$, $r_b$, and $r_c$ are different, and the write start positions with respect to positions $r_a$, $r_b$, and $r_c$ are arranged $X_a$, $X_b$, and $X_c$ respectively in the backward circumferential direction. The encoder pulse is generated at a constant period as the substrate rotates in "A" direction. In the present embodiment, the writing is started after a predetermined time from an encoder pulse that occurs ahead of each of the write start positions in the circumferential direction and immediately ahead of the write start position. The reference encoder pulse and the predetermined time counted from the pulse for each radial direction position are determined in advance according to a desired writing pattern, and encoder pulses detected from the encoder and writing pattern data from the output unit are synchronized in the controller, whereby the writing at each radial direction position is performed With respect to radial direction position $r_a$, the pattern data are synchronized with encoder pulse $A_6$, whereby the blanking is turned OFF after time $t_a$ from the occurrence of encoder pulse $A_6$, and writing is started from write start position $X_a$. Likewise, with respect to radial direction position $r_b$, the pattern data are synchronized with encoder pulse $A_3$, whereby the blanking is turned OFF after time $t_b$ from the generation of encoder pulse $A_3$, and writing is started from write start position $X_b$.

Here, the description has been made of a case in which the writing is started based on the immediately preceding encoder pulse and after a predetermined time from the encoder pulse. But the encoder pulse determined in advance may be a pulse that occurs after a predefined encoder pulse that occurs ahead in a rotational direction of a radial direction position whose write start position in the circumferential direction in the servo area arrives first at the writing position as the rotation stage rotates ($A_1$ in FIG. 6C) and ahead of the write start position in the circumferential direction with respect to each radial direction position. In comparison with a conventional method in which the write start timings with respect to all radial direction positions are controlled based on a reference signal generated ahead in a rotational direction of a radial direction position whose write start position (EB irradiation position) in the circumferential direction in the servo area arrives first as the rotation stage rotates (FIGS. 12 and 13), the write start timing of each radial direction position is controlled based on an encoder pulse closer to the write start position, so that the positional displacement of each write start position may be reduced, allowing more accurate pattern writing.

The encoder pulse predetermined with respect to each radial direction position is preferable to be an encoder pulse generated 30 mrad, more preferably 20 mrad, further preferably 5 mrad, and most preferably immediately ahead of the write start position with respect to each radial direction position, as in the embodiment described above. Unlike the number of servo areas and the curvature of the arc typically employed, FIG. 4 illustrates less number of servo areas (8 areas) with a larger curvature for the arc of the servo areas for facilitating understanding. Thus, the amount of rotation from encoder pulse occurrence position to each write start position differs greatly from actual amount, depicted very largely.

As already described, FIG. 7 is a graph illustrating the relationship between the number of pulses from predetermined encoder pulses (only from A-phase encoder pulses) and the mount of positional displacement (nm) using a rotary encoder having a predetermined number of encoder slits. FIG. 7 shows that, in both of the rotational speeds, positional displacement occurs in the amounts of not less than 10 nm and not less than 20 nm when the rotation amount exceeds 30 mrad and 100 mrad from the reference measurement position respectively.

In the mean time, as FIG. 7 shows, the positional displacement may be reduced to not greater than about 10 nm by limiting the distance between the encoder pulse occurrence position and write start position to not greater than 30 mrad and selecting an appropriate rotational speed. Further, it has been known that the positional displacement may be reduced to not greater than about 10 nm by limiting the distance between the encoder pulse occurrence position and write start position to not greater than 20 mrad without any limitation to the rotational speed. It is preferable that the positional displacement be not greater than 8 nm and more preferably not greater than 5 nm as the pattern getting finer. This can be achieved by limiting the distance between the encoder pulse occurrence position and write start position to not greater than 10 mrad or further to not greater than 5 mrad. In order to minimize the positional displacement, it is necessary to use an encoder pulse generated immediately ahead of the write start position as the reference, as in the embodiment described above, if the distance is within 30 mrad, the positional displacement may be reduced to not greater than about 10 nm, which allows sufficiently accurate pattern writing when the bit length of one element is 100 nm. It is preferable that the amount of positional displacement is reduced to not greater than 10% of the bit length, and hence it is necessary to select a desirable encoder pulse according to the desired bit length.

For example, where the bit length is on the order of 80 nm, the positional displacement may be reduced to not greater than 10% by limiting the distance between the reference encoder pulse generation position and write start position to not greater than 10 mrad.

Figure 8B:
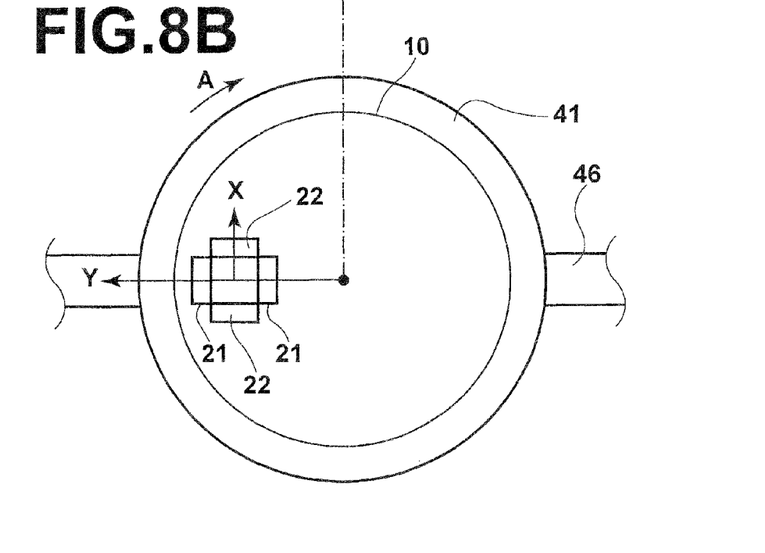
FIG. 8B is a partial plan view of the fine pattern writing system shown in FIG. 8A.

In order to perform the writing described above, fine pattern writing system 20 shown in FIGS. 8A and 8B is used. FIG. 8A is a relevant side view of the fine pattern writing system according to an embodiment for implementing the electron beam writing method of the present invention, and FIG. 8B is a partial plan view thereof.

Fine pattern writing system 20 includes electron beam writing unit 40 and signal output unit 60. Electron beam writing unit 40 includes rotation stage unit 45 having rotation stage 41 and spindle motor 44 having a motor axis aligned with central axis 42 of rotation stage 41; shaft 46 passing through a portion of rotation stage unit 45 and extending in radial direction Y of rotation stage 41; and linear moving means 49 for moving rotation stage unit 45 along shaft 46. Rod 47 with accurate threading and disposed parallel to shaft 46 is screwed to a portion of rotation stage unit 45. Rod 47 is rotatable in the forward and reverse directions by pulse motor 48, and linear moving means 49 of rotation stage unit 45 is formed by rod 47 and pulse motor 48. Further, encoder 53 that generates encoder pulses at regular intervals and predetermined rotation phases by reading encoder slits is installed for detecting the rotation of rotation stage 41, and the encoder pulse signal is outputted to controller 50. Controller 50 further includes a clock unit (not shown) therein that generates the reference clock signal in the timing control.

Electron beam writing unit 40 further includes electron gun 23 that emits electron beam EB, deflection means 21, 22 that deflect electron beam EB in radial direction Y and circumferential direction X, as well as microscopically vibrating the beam back and forth in circumferential direction X with a predetermined amplitude, and aperture 25 and blanking 26 (deflector) as blanking means 24 for turning the irradiation of electron beam EB ON and OFF. Electron beam EB emitted from electron gun 23 is irradiated on substrate 10 through deflection means 21, 22, a not shown lens, and the like.

Aperture 25 of blanking means 24 has a through hole for passing electron beam EB in the center, and blanking 26 operates according to input of ON/OFF signals, in which it passes electron beam EB through the through hole of aperture 25 during OFF-signal without deflecting the beam, while it blocks electron beam EB with aperture 25 by deflecting the beam so as not to be passed through the through hole during ON-signal, so that electron beam EB is not irradiated. Then, while each element 13 is being written, OFF-signal is inputted to irradiate electron beam EB, and ON-signal is inputted during a migration period between elements 13 to block electron beam EB so that exposure is not performed.

Drive control of spindle motor 44, that is, the rotational speed of rotation stage 41, driving of pulse motor 48, that is, the linear movement of linear moving means 49, modulation of electron beam EB, control of deflection means 21, 22, ON/OFF control of blanking 26 of blanking means 24, and the like are performed based on control signals outputted from controller 50 serving as the control means.

Signal output unit 60 stores therein write data of a fine pattern, such as servo patterns 12 and outputs the write data signal to controller 50. Controller 50 performs the associated control described above based on the write data signal, and electron beam writing unit 40 writes servo patterns 12 of the fine pattern on the entire surface of substrate 10.

Substrate 10 to be placed on rotation stage 41 is made of, for example, silicon, glass, or quartz and a positive or negative electron beam writing resist 11 is applied on a surface thereof in advance. Preferably, the power and beam diameter are controlled taking into account the sensitivity of electron beam writing resist 11 and the shape of each element 13.

Figure 9:
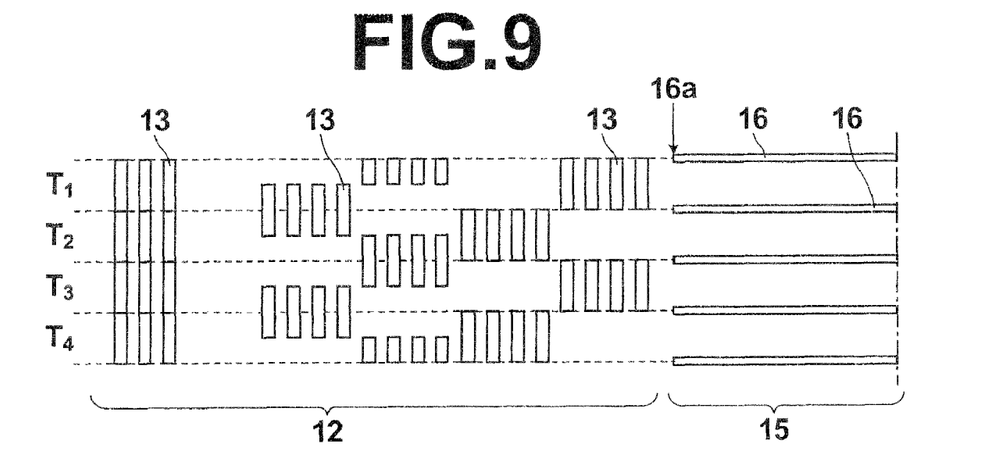
FIG. 9 is a partially enlarged view of a fine pattern of a discrete track medium.

In a discrete track medium which has recently been drawing attention, as a portion of hard disk pattern of which is shown in FIG. 9 in an enlarged form, groove patterns 16 extending in a track direction to separate each of adjacent data tracks T1 to T4 in a groove-like manner are concentrically formed in guard band areas between each data track of data area 15, in addition to servo patterns formed in the servo areas described above. The groove patterns are written based on separate writing control from that of the servo patterns. However, in accordance with servo area 12 provided in an arc shape curved out from the radial center side to outside, the data area 15 between the servo areas is also provided in an arc shape curved out from the radial center side to outside. Therefore, each write start position 16a of each groove pattern 16 may be controlled such that writing is started with respect to each radial direction position of each area based on a predetermined encoder pulse for each radial direction position among those generated according to the rotational angle of the rotation stage that occurs after a predefined encoder pulse that occurs ahead in a rotational direction of a radial direction position whose write start position in a circumferential direction in each area arrives first at the writing position as the rotation stage rotates and ahead of the write start position in the circumferential direction with respect to each radial direction position, and after a predetermined time from the predetermined encoder pulse, as in the write start timing control in the pattern writing of servo areas described above, whereby the groove start position with respect to each radial direction position (each track) may be set accurately.

In the embodiment described above, the description has been made of a case in which, as the writing method, each fine element is written such that the element shape is completely filled by the electron beam by rapidly vibrating the electron beam in the circumferential direction and deflecting in the radial direction. Where a conventional on/off writing method or a writing method in which the electron beam is rapidly vibrated in a radial direction is used, the present invention may be applied to the timing control of the write start position of each position in the radial direction of each servo area or data area, whereby the identical advantage of improvement in the positioning of the write start position may be obtained.

Figure 10:
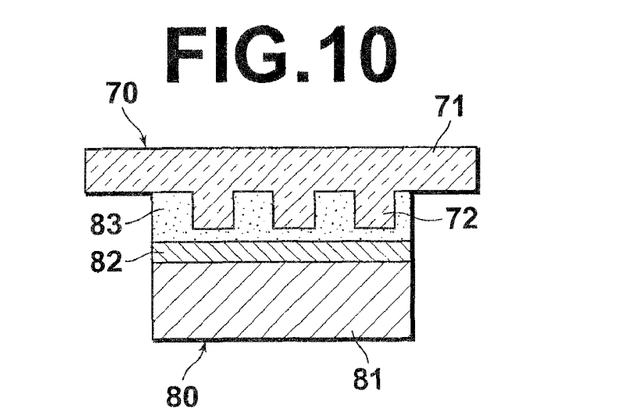
FIG. 10 is a schematic cross-sectional view illustrating a process in which a fine pattern is transfer formed on a magnetic disk medium using an imprint mold having a fine pattern written by the electron beam writing method or the fine pattern writing system.

Next, a method for manufacturing an imprint mold (uneven pattern carrying substrate) to be produced through the step of writing a fine pattern by the electron beam writing method using fine pattern writing system 20, and a method for manufacturing a magnetic disk medium using the imprint mold will be described. FIG. 10 is a schematic cross-sectional view illustrating a process in which a fine uneven pattern is transfer formed.

Imprint mold 70 is obtained in the following manner. That is, resist 11 (not shown in FIG. 10) is applied on a surface of substrate 71 made of a transparent material and servo patterns 12 and groove patterns 16 are written thereon. Thereafter, resist 11 is processed to form an uneven pattern of the resist on substrate 71. Substrate 71 is etched with the patterned resist as the mask, and then the resist is removed, whereby imprint mold 70 having fine uneven pattern 72 formed thereon is obtained. As an example, fine uneven pattern 72 includes servo patterns and groove patterns for a discrete track medium.

Magnetic disk medium 80 is formed by imprint method using imprint mold 70. Magnetic disk medium 80 includes substrate 81 on which magnetic layer 82 is stacked and resist resin layer 83 for forming a mask layer is provided thereon. The uneven shape of fine uneven pattern 72 is transfer formed by pressing fine uneven pattern 72 of imprint mold 70 against resist resin layer 83 and solidifying resist resin layer 83 by ultraviolet radiation. Thereafter, magnetic layer 82 is etched based on the uneven shape of resist resin layer 83 to form magnetic disk medium 80 of discrete track medium with the fine uneven pattern formed on magnetic layer 82.

The above description is a manufacturing process of a discrete track medium, but a bit pattern medium may also be manufactured through an identical process.

Figure 11A:
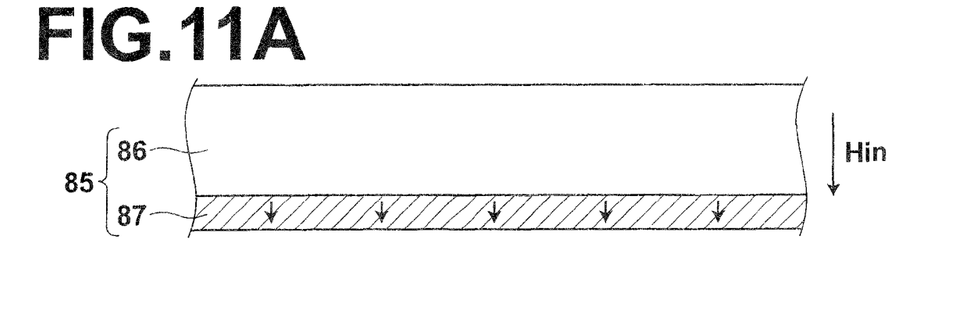
FIGS. 11A to 11C are schematic cross-sectional views illustrating a transfer-forming process of a fine pattern on a magnetic disk medium using a magnetic transfer master having a fine pattern written by the electron beam writing method or the fine pattern writing system.
Figure 11B:
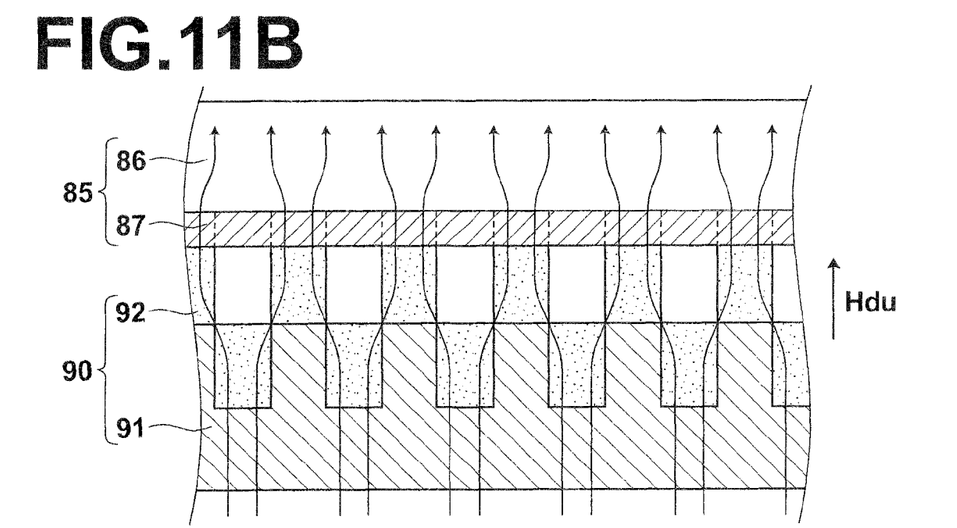
Figure 11C:
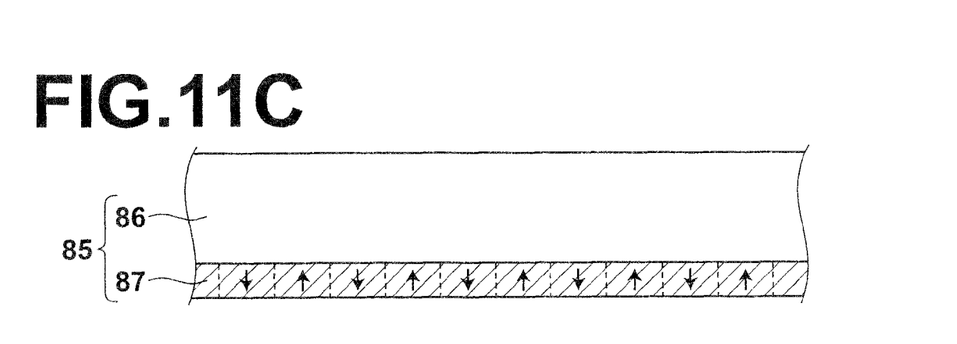

Next, a method for manufacturing a magnetic transfer master substrate (uneven pattern carrying substrate) to be produced through the step of writing a fine pattern by the electron beam writing method using fine pattern writing system 20 and a method for manufacturing a magnetic disk medium using the magnetic transfer master substrate will be described. FIGS. 11A to 11C are schematic cross-sectional views, illustrating a magnetic transfer process of a magnetic pattern to magnetic disk medium 85 using magnetic transfer master substrate 90.

The manufacturing process of magnetic transfer master substrate 90 is substantially identical to that of imprint mold 70. Substrate 10 to be placed on rotation stage 41 is made of, for example, a silicon, glass, or quartz disk, and positive or negative electron beam writing resist 11 is applied thereon. Then resist 11 is scanned with an electron beam to write a desired pattern thereon. Thereafter, resist 11 is processed to obtain substrate 10 having an uneven pattern of the resist, which is an original master of magnetic transfer master substrate 90.

Next, a thin conductive layer is formed on the surface of the uneven pattern formed on the surface of the original master, and electro forming is performed thereon to obtain substrate 91 having an uneven pattern of metal casting. Thereafter, substrate 91 having a predetermined thickness is peeled off from the original master. The uneven pattern on the surface of substrate 91 is a reverse pattern of the uneven shape of the original master.

After grinding the rear surface of substrate 91, magnetic layer 92 (soft magnetic layer) is stacked on the uneven pattern to obtain magnetic transfer master substrate 90. The shape of a convex portion or concave portion of the uneven pattern on the surface of substrate 91 depends on the uneven pattern of the resist of the original master.

A magnetic transfer method using magnetic transfer master substrate 90 manufactured in the manner as described above will now be described. Magnetic disk medium 85 which is a medium to which information is transferred is, for example, a hard disk, flexible disk, or the like which includes substrate 86 having magnetic recording layer 87 formed on either one of the sides or on both sides. Here, it is assumed to be a vertical magnetic recording medium in which the easy direction of magnetization of magnetic recording layer 87 is perpendicular to the recording surface.

As illustrated in FIG. 11A, initial DC field Hin is applied to magnetic disk medium 85 in a direction perpendicular to the track surface in advance to initially DC-magnetize magnetic recording layer 87. Thereafter, as illustrated in FIG. 11B, magnetic transfer is performed by bringing the surface of magnetic disk medium 85 on the side of recoding layer 87 into close contact with the surface of master substrate 90 on the side of magnetic layer 92 and applying transfer field Hdu in a direction perpendicular to the track surface of magnetic disk medium 85 and opposite to the direction of initial DC field Hin. As the result, as shown in FIG. 11C, the transfer field is drawn into magnetic layer 92 of master substrate 90 and the magnetization of magnetic layer 87 of magnetic recording medium 85 at the portions corresponding to the convex portions of magnetic layer 92 of master substrate 90 is reversed, while the magnetization of the other portions is not reversed. Consequently, information (e.g., servo signal) corresponding to the uneven pattern of master substrate 90 is magnetically transfer recorded on magnetic recording layer 87 of magnetic disk medium 85. Note that, when performing magnetic transfer also to the upper side recording layer of magnetic disk medium 85, the magnetic transfer is performed at the same time with the magnetic transfer of the lower side recording layer by bringing the upper side recording layer and an upper side master substrate into close contact with each other.

In the case of magnetic transfer to a longitudinal magnetic recording medium, master substrate 90 which is substantially the same as that used for the vertical magnetic recording medium is used. For the longitudinal recording medium, the magnetic disk medium is DC-magnetized along a track direction in advance. Then magnetic transfer is performed by bringing the magnetic disk medium into close contact with the master substrate and applying a transfer field in the direction opposite to that of the initial DC magnetization. The transfer magnetic field is drawn into convex portions of the magnetic layer of the master substrate 90 resulting in that the magnetization of the portions of the magnetic layer of the magnetic disk medium corresponding to the convex portions is not reversed while the magnetization of the other portions is reversed. In this way, a magnetic pattern corresponding to the uneven pattern may be recorded on the magnetic disk medium.

The above described manufacturing method of the imprint mold or magnetic transfer master substrate using the electron beam writing method of the present invention is illustrative only. The method is not limited to this and any method may be used as long as it has a process of writing a fine pattern to form an uneven pattern using the electron beam writing method of the present invention

What is claimed is:

1. An electron beam writing method for writing a pattern on a substrate applied with a resist and placed on a rotation stage having a rotary encoder by scanning an electron beam on the substrate while rotating the rotation stage,
wherein, when writing a hard disk pattern constituted by a plurality of servo areas, each extending in an arc from the radial center side to outside and data areas, each between each of the servo areas, writing is started with respect to the associated radial direction position of each of the servo areas based on a predetermined encoder pulse for the associated radial direction position among those encoder pulses generated according to the rotational angle of the rotation stage that occurs after a predefined encoder pulse that occurs ahead in a rotational direction of a radial direction position whose write start position in a circumferential direction in each of the servo areas arrives first at the writing position as the rotation stage rotates and ahead of the write start position in the circumferential direction with respect to the associated radial direction position, and after a predetermined time from the predetermined encoder pulse.

2. The electron beam writing method as claimed in claim 1, wherein the predetermined encoder pulse for the associated radial direction position is an encoder pulse that occurs at a rotational position of the rotation stage within 30 mrad ahead of the write start position in the circumferential direction of the associated radial direction position.

3. The electron beam writing method as claimed in claim 1, wherein the predetermined encoder pulse for the associated radial direction position is an encoder pulse that occurs immediately ahead of the write start position in the circumferential direction of the associated radial direction position.

4. The electron beam writing method as claimed in claim 1, wherein a pattern of a plurality of fine elements constituting the servo area is written by scan controlling the electron beam so as to completely fill the shapes of the elements in sequence by rapidly vibrating the electron beam back and forth in a direction orthogonal to the radial direction of the rotation stage and X-Y deflecting the electron beam in the radial direction of the rotation stage and the direction orthogonal to the radial direction while rotating the substrate in one direction.

5. A fine pattern writing system for realizing the electron beam writing method as claimed in claim 1, comprising a signal output unit for outputting a write data signal and an electron beam writing unit for scanning an electron beam.

6. The fine pattern writing system as claimed in claim 5, wherein:
the electron beam writing unit includes a rotation stage movable in a radial direction thereof while rotating a substrate applied with a resist, an electron gun that emits an electron beam, a deflection means that X-Y deflects the electron beam in the radial direction of the rotation stage and a direction orthogonal to the radial direction and rapidly vibrates the electron beam in the direction orthogonal to the radial direction, a blanking means that blocks the radiation of the electron beam other than a writing area, and a controller that performs associated operation control of each of the means; and
the signal output unit is a unit that outputs a write data signal to the controller of the electron beam writing unit based on data corresponding to the form of a fine pattern to be written on the substrate, and wherein
the controller is a controller that performs control such that, when writing a hard disk pattern constituted by a plurality of servo areas, each extending in an arc from the radial center side to outside and data areas, each between each of the servo areas, writing is started at each position of each of the servo areas in a radial direction based on a predetermined encoder pulse for the associated radial direction position among those encoder pulses generated according to the rotational angle of the rotation stage that occurs after a predefined encoder pulse that occurs ahead, in a rotational direction of the rotation stage, of a radial direction position whose write start position in a circumferential direction in each of the servo areas arrives first at the writing position as the rotation stage rotates and ahead of the write start position of the associated radial direction position, and after a predetermined time from the predetermined encoder pulse.

7. A method for manufacturing an uneven pattern carrying substrate, comprising the steps of:
exposure writing a desired fine pattern on a substrate applied with a resist by the electron beam writing method as claimed in claim 1; and
forming an uneven pattern corresponding to the desired fine pattern on the substrate.

8. A method for manufacturing a magnetic disk medium, wherein the method uses an imprint mold produced through the steps of exposure writing a desired fine pattern on a substrate applied with a resist by the electron beam writing method as claimed in claim 1 and forming an uneven pattern corresponding to the desired fine pattern on the substrate to transfer an uneven pattern corresponding to the uneven pattern provided on the surface of the mold to the magnetic disk medium.

9. A method for manufacturing a magnetic disk medium, wherein the method uses a magnetic transfer master substrate produced through the steps of exposure writing a desired fine pattern on a substrate applied with a resist by the electron beam writing method as claimed in claim 1 and forming an uneven pattern corresponding to the desired fine pattern on the substrate to transfer a magnetic pattern corresponding to the uneven pattern provided on the surface of the master substrate to the magnetic disk medium.

* * * * *